(12) United States Patent
Sung

(10) Patent No.: US 11,930,688 B2
(45) Date of Patent: Mar. 12, 2024

(54) DISPLAY DEVICE FOR BLOCKING PENETRATION OF MOISTURE INTO INTERIOR WHILE EXTENDING CATHODE ELECTRODE

(71) Applicant: LG DISPLAY CO., LTD., Seoul (KR)

(72) Inventor: Kiyoung Sung, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/942,200

(22) Filed: Sep. 12, 2022

(65) Prior Publication Data

US 2023/0209977 A1 Jun. 29, 2023

(30) Foreign Application Priority Data

Dec. 28, 2021 (KR) .......................... 10-2021-0190221

(51) Int. Cl.
| | |
|---|---|
| *G06F 3/041* | (2006.01) |
| *H10K 59/131* | (2023.01) |
| *H10K 59/88* | (2023.01) |
| *G06F 3/044* | (2006.01) |
| *H10K 50/844* | (2023.01) |

(52) U.S. Cl.
CPC ........... *H10K 59/88* (2023.02); *G06F 3/0412* (2013.01); *G06F 3/04164* (2019.05); *H10K 59/131* (2023.02); *G06F 3/0446* (2019.05); *H10K 50/844* (2023.02)

(58) Field of Classification Search
CPC .. G06F 3/04164; G06F 3/0412; G06F 3/0446; H10K 59/88; H10K 59/131; H10K 50/844
See application file for complete search history.

(56) References Cited

U.S. PATENT DOCUMENTS

2020/0176520 A1* 6/2020 Kim ...................... H10K 50/844
2020/0212159 A1* 7/2020 Lee ....................... H10K 59/131

FOREIGN PATENT DOCUMENTS

| KR | 2020-0113957 A | 10/2020 |
|---|---|---|
| KR | 2021-0011213 A | 2/2021 |

* cited by examiner

*Primary Examiner* — Lisa S Landis
(74) *Attorney, Agent, or Firm* — POLSINELLI PC

(57) ABSTRACT

A display device includes a substrate including a display area and a non-display area surrounding the display area, the display device further includes a gate driving circuit disposed on the substrate and in the non-display area, the display device further includes a light emitting element disposed in the display area and on the substrate and including a cathode electrode, the display device further includes a dam disposed on the substrate and in the non-display area, the dam further outside the substrate than the gate driving circuit, the display device further includes a first dummy conductive layer disposed to cover the dam and made of the same material as the cathode electrode, and a spacer disposed between the gate driving circuit and the dam, and the cathode electrode extends from the display area to the non-display area to overlap with the gate driving circuit.

15 Claims, 5 Drawing Sheets

DISPLAY DEVICE FOR BLOCKING PENETRATION OF MOISTURE INTO INTERIOR WHILE EXTENDING CATHODE ELECTRODE

CROSS-REFERENCE TO RELATED APPLICATION

This application claims the priority of Korean Patent Application No. 10-2021-0190221 filed on Dec. 28, 2021, which is hereby incorporated by reference in its entirety.

BACKGROUND

Field of the Disclosure

The present disclosure relates to a display device, and more particularly, to a display device capable of improving reliability.

Description of the Background

As the information society has been developed, the demand for a display device that displays an image has increased, and various types of display devices such as a liquid crystal display device and an organic light emitting display device are used.

These display devices provide a function of recognizing a user's touch on a display panel and performing input processing based on the recognized touch in order to provide more various functions to the user.

The display device capable of recognizing the touch includes a plurality of touch electrodes disposed or embedded in the display panel, and may detect the presence or absence of a user's touch on the display panel, touch coordinates, and the like by driving the touch electrodes.

SUMMARY

Accordingly, the present disclosure is to provide a display device capable of reducing the noise of a touch sensing signal due to signal interference between a gate driving circuit and a touch routing line.

The present disclosure is also to provide a display device capable of blocking the penetration of moisture into the display device while extending a cathode electrode.

Further, the present disclosure is to provide a display device capable of suppressing touch performance from being deteriorated so as to enable accurate touch sensing.

The present disclosure is not limited to the above-mentioned and other features, which are not mentioned above, can be clearly understood by those skilled in the art from the following descriptions.

According to an aspect of the present disclosure, a display device includes a substrate including a display area and a non-display area surrounding the display area, a gate driving circuit disposed on the substrate and in the non-display area, a light emitting element disposed in the display area on the substrate and including a cathode electrode, a dam disposed on the substrate and in the non-display area, the dam further outside the substrate than the gate driving circuit, a first dummy conductive layer disposed to cover the dam and made of the same material as the cathode electrode, and a spacer disposed between the gate driving circuit and the dam on the substrate, in which the cathode electrode extends from the display area to the non-display area to overlap with the gate driving circuit.

According to another aspect of the present disclosure, a display device includes a substrate including a display area and a non-display area surrounding the display area, a gate driving circuit disposed on the substrate and in the non-display area, a light emitting element disposed in the display area on the substrate and including a cathode electrode, a dam disposed on the substrate and in the non-display area, the dam further outside the substrate than the gate driving circuit, a first dummy conductive layer disposed to cover the dam and made of the same material as the cathode electrode, a plurality of spacers disposed between the gate driving circuit and the dam on the substrate, and a second dummy conductive layer disposed on the plurality of spacers and made of the same material as the cathode electrode, in which the cathode electrode extends from the display area to the non-display area to overlap with the gate driving circuit.

Other detailed matters of the exemplary aspects are included in the detailed description and the drawings.

According to the present disclosure, moisture from penetrating into the display device can be suppressed and reliability by disposing the spacer between the dam and the display area to disconnect the extended cathode electrode can be improved.

According to the present disclosure, the occurrence of interference between the driving signal and the touch signal by extending the cathode electrode can be minimized.

According to the present disclosure, touch precision by reducing noise capable of reaching at touch sensing unit can be improved.

The effects according to the present disclosure are not limited to the contents exemplified above, and more various effects are included in the present specification.

BRIEF DESCRIPTION OF THE DRAWINGS

The above and other aspects, features, and other advantages of the present disclosure will be more clearly understood from the following detailed description taken in conjunction with the accompanying drawings, in which.

DETAILED DESCRIPTION

Figure 1:
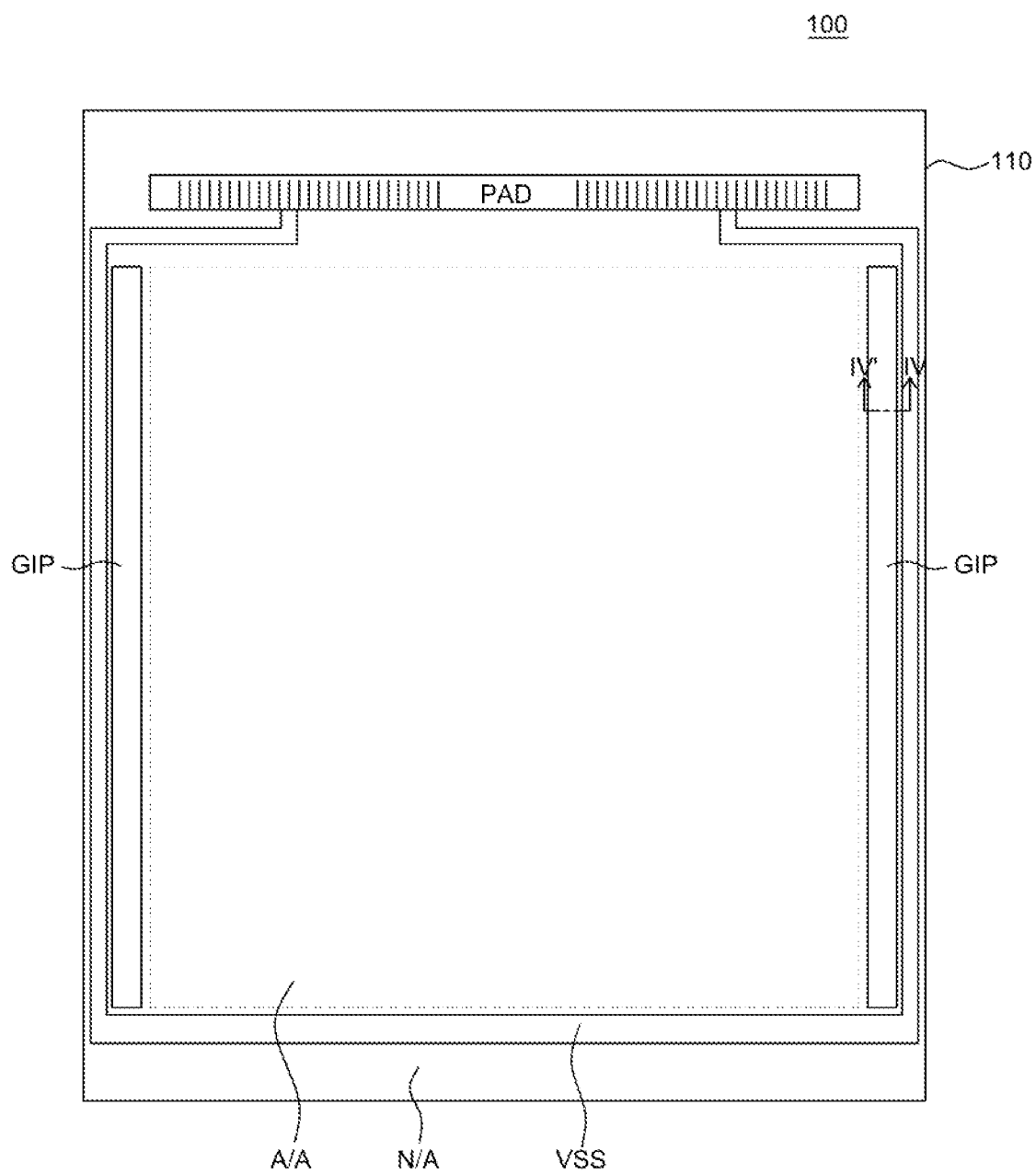
FIG. 1 is a schematic plan view of a display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, a display device according to exemplary aspects of the present disclosure will be described in detail with reference to accompanying drawings.

FIG. 1 is a schematic plan view of a display device according to an exemplary aspect of the present disclosure. In FIG. 1, for convenience of description, among various components of a display device 100, a substrate 110, a pad PAD, a gate driving circuit GIP, and a low potential voltage line VSS are just illustrated.

Referring to FIG. 1, the display device 100 includes at least one display area A/A, and an array of pixels is formed in the display area A/A. A non-display area N/A may be disposed to surround the display area A/A. That is, the non-display area N/A may be adjacent to one or more side surfaces of the display area A/A. In FIG. 1, the non-display area N/A surrounds a quadrangular display area A/A. However, the shape of the display area A/A and the shape/disposition of the non-display area N/A adjacent to the display area A/A are not limited to the example illustrated in FIG. 1.

Each pixel in the display area A/A may be associated with a pixel circuit. The pixel circuit may include one or more switching transistors and one or more driving transistors on a backplane. Each pixel circuit may be electrically connected to a gate line and a data line to communicate with one or more driving circuits such as a gate driving circuit GIP and a data driving circuit located in the non-display area N/A. In addition, each pixel circuit may be connected to power supply lines VDD, VSS, VREF, etc. located in the non-display area N/A to receive a voltage required for driving. The driving circuit may be implemented as a thin film transistor (TFT) in the non-display area N/A, as illustrated in FIG. 1. Such a driving circuit may be referred to as a gate-in-panel (GIP). In addition, some components, such as a data driver IC, are mounted on a separate printed circuit board and may be coupled to a connection interface (PAD, bump, pin, etc.) disposed in the non-display area N/A using circuit films such as a flexible printed circuit board (FPCB), a chip-on-film (COF), and a tape carrier-package (TCP). The gate driving circuit GIP may be disposed on at least one side of the left and right sides of the display area A/A.

A power supply unit of the display device 100 outputs a high potential voltage, a low potential voltage, and the like. The high potential voltage, the low potential voltage, and the like output from the power supply unit are supplied to the display device 100. The high potential voltage is supplied to the display panel through a high potential voltage line, and the low potential voltage is supplied to the display device 100 through a low potential voltage line VSS. The voltage output from the power supply unit is also used in the data driving circuit or the gate driving circuit GIP. In particular, the low potential voltage line VSS is a line that may be electrically connected to a second electrode of a light emitting element to be described below, and may be disposed to surround the gate driving circuit GIP and the display area A/A.

In addition, the non-display area N/A may include a pad unit, and the pad unit may include a plurality of pads PAD. Specifically, the plurality of pads PAD may include a plurality of common power supply pads, a plurality of data input pads, a plurality of power supply pads, a plurality of control signal input pads, a plurality of touch driving pads, and the like.

The display device 100 may further include various additional elements for generating various signals or driving pixels in the display area A/A. The additional elements for driving the pixels may be an inverter circuit, a multiplexer, an electrostatic discharge circuit, and the like. The display device 100 may also include additional elements associated with functions other than driving pixels. For example, the display device 100 may include additional elements that provide a touch sensing function, a user authentication function (e.g., fingerprint recognition), a multi-level pressure sensing function, a tactile feedback function, and the like. The above-mentioned additional elements may be located in the non-display area N/A and/or in an external circuit connected to the connection interface.

Figure 2:
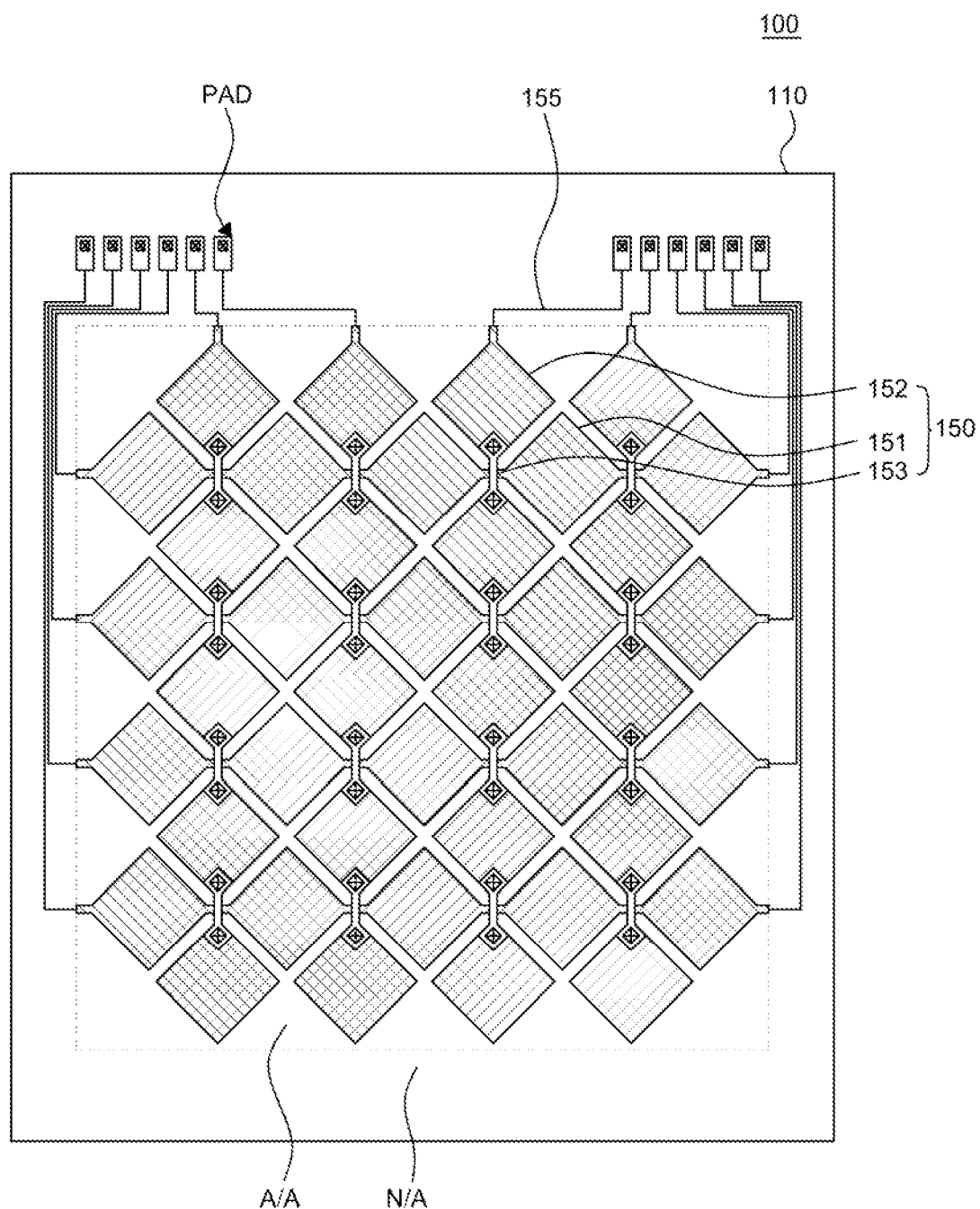
FIG. 2 is a schematic plan view of a display device according to an exemplary aspect of the present disclosure.

FIG. 2 is a schematic plan view of the display device according to the exemplary aspect of the present disclosure. In FIG. 2, for convenience of description, among various components of the display device 100, the substrate 110, the touch sensing unit 150, the touch routing line 155, and the plurality of pads PAD are just illustrated.

Recently, in order to reduce the thickness of the display device and improve visibility, a touch panel-integrated display device in which a touch electrode and the like are disposed directly on an encapsulation unit of the display device has been developed. The display device 100 according to the exemplary aspect of the present disclosure is a touch panel-integrated display device, and the touch sensing unit 150 may be formed on the encapsulation unit of the display device 100.

Referring to FIG. 2, the display device 100 includes the touch sensing unit 150, the plurality of touch routing lines 155, and the plurality of touch pads PAD. Here, the touch sensing unit 150 includes a plurality of first touch electrodes 151, a plurality of second touch electrodes 152, and a connection electrode 153.

The plurality of first touch electrodes 151 may be touch driving electrodes, and the plurality of second touch electrodes 152 may be touch sensing electrodes. The plurality of first touch electrodes 151 is connected to each other in a row direction to form a plurality of electrode rows, and the plurality of second touch electrodes 152 is connected to each other in a longitudinal direction by the connection electrode 153 to form a plurality of electrode columns.

The first touch electrodes 151 and the second touch electrodes 152 may be disposed on the same layer. However, in a region where the first touch electrode 151 and the second touch electrode 152 intersect, the second touch electrodes 152 are disposed separately, and the second touch electrodes 152 separated from each other may be connected to each other by the connection electrode 153.

In this case, the first touch electrode 151, the second touch electrode 152, and the connection electrode 153 are disposed in an area corresponding to the display area A/A of the display device 100.

The external shapes of the first touch electrode 151 and the second touch electrode 152 may correspond to specific shapes. For example, as illustrated in FIG. 2, the external shapes of the first touch electrode 151 and the second touch electrode 152 may have mesh patterns including a plurality of rhombus shapes. The first touch electrode 151 and the second touch electrode 152 may be made of metal including at least one of titanium (Ti), aluminum (Al), molybdenum (Mo), molytitanium (MoTi), copper (Cu), and tantalum (Ta) and may be made of a transparent conductive material such as indium tin oxide (ITO) or indium zinc oxide (IZO), but is not limited thereto. Light emitted from the display device 100 may pass through the first touch electrode 151 and the second touch electrode 152 made of the transparent conductive material to be emitted to the outside. However, the present disclosure is not limited thereto, and the light emitted from the display device 100 may also be emitted to the outside through a plurality of openings included in the first touch electrode 151 and the second touch electrode 152.

The non-display area N/A is an area surrounding the display area A/A, and the plurality of touch routing line 155 and the plurality of touch pads PAD are disposed.

Each of the plurality of touch routing lines 155 electrically connects each of the plurality of touch electrodes 151 and 152 disposed in the display area A/A to the touch pad of the non-display area N/A. For example, a touch driving signal may be applied to the first touch electrode 151 through the touch routing line 155 connected to the first touch electrode 151, and a touch sensing signal may be transmitted to the second touch electrode 152 through the touch routing line 155 connected to the second touch electrode 152.

These touch routing lines 155 may be made of a low-resistance metal material, and may also be made of a transparent conductive material such as ITO or IZO, but are not limited thereto. For example, when the plurality of touch routing lines 155 is made of the low-resistance metal material, resistance may be lowered, thereby reducing an RC delay.

One end of the plurality of touch pads PAD is connected to the touch routing line 155, and the other end thereof is electrically connected to an external circuit such as a touch driving unit to receive a touch signal from the external circuit or to transmit a touch sensing signal to the external circuit.

In this case, the plurality of touch routing lines 155 and the plurality of touch pads PAD are disposed in an area corresponding to the non-display area N/A of the display device 100.

Hereinafter, a cross-sectional structure of the display area A/A of the display device 100 will be described in more detail with reference to FIG. 3 together.

Figure 3:
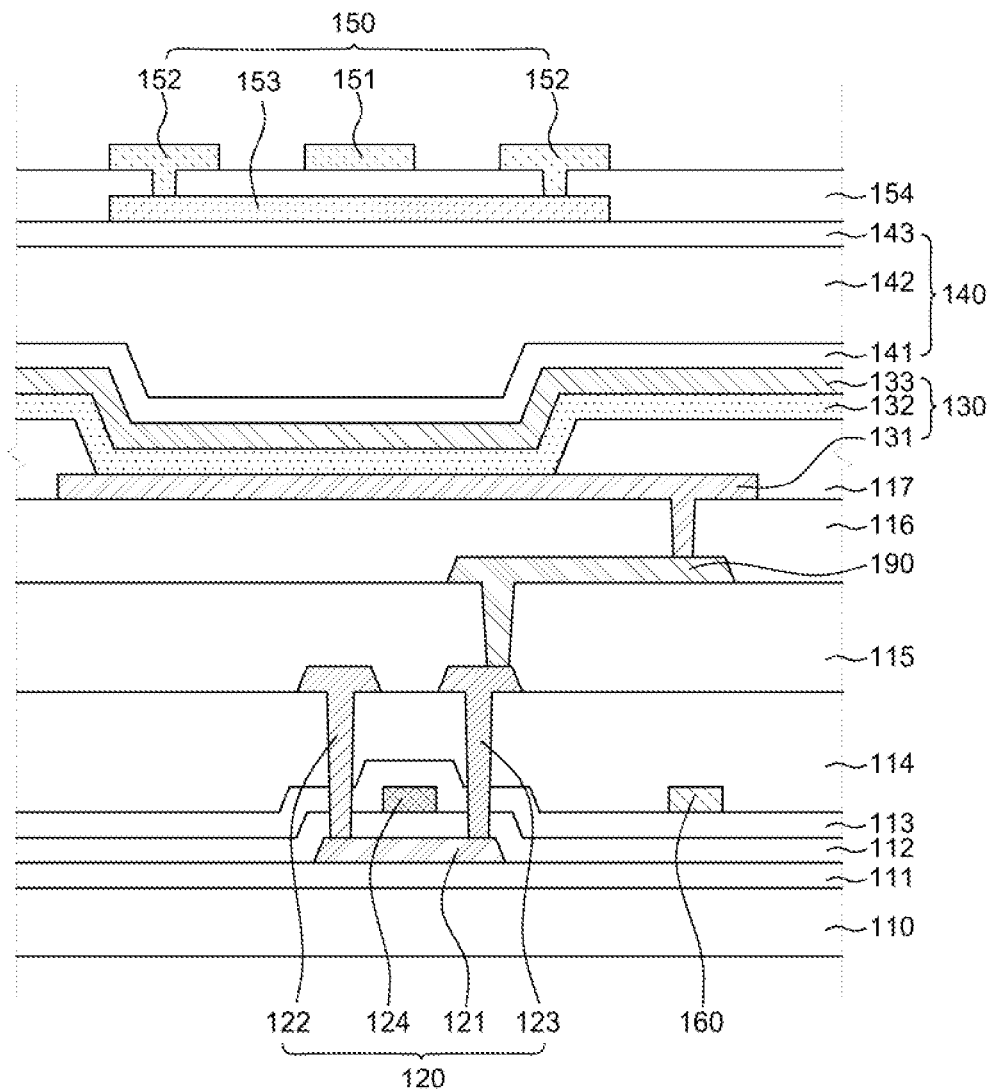
FIG. 3 is a cross-sectional view of a display device according to an exemplary aspect of the present disclosure.

FIG. 3 is a cross-sectional view of the display device according to the exemplary aspect of the present disclosure.

Referring to FIG. 3, the display device 100 according to the exemplary aspect of the present disclosure may include a substrate 110, a buffer layer 111, a first thin film transistor 120, a gate insulating layer 112, a first interlayer insulating layer 113, a conductive layer 160, a second interlayer insulating layer 114, a first planarization layer 115, a connection electrode 190, a second planarization layer 116, a bank 117, a light emitting element 130, an encapsulation unit 140, a touch insulating layer 154, and a touch sensing unit 150.

The substrate 110 may support various components of the display device 100. The substrate 110 may be made of glass or a plastic material having flexibility. When the substrate 110 is made of the plastic material, the substrate 110 may be made of, for example, polyimide (PI).

The buffer layer 111 may be disposed on the substrate 110. The buffer layer 111 may be formed of a single layer of silicon nitride (SiNx) or silicon oxide (SiOx) or a multilayer thereof. The buffer layer 111 may serve to enhance adhesion between layers formed on the buffer layer 111 and the substrate 110 and block an alkali component, and the like which leaks from the substrate 110.

The thin film transistor 120 may be disposed on the buffer layer 111. The thin film transistor 120 includes an active layer 121, a gate electrode 124, a source electrode 122, and a drain electrode 123. Here, depending on a design of the pixel circuit, the source electrode 122 may be a drain electrode, and the drain electrode 123 may be a source electrode. The active layer 121 of the thin film transistor 120 may be disposed on the buffer layer 111.

The active layer 121 may be made of various materials such as polysilicon, amorphous silicon, and oxide semiconductor. The active layer 121 may include a channel region in which a channel is formed when the thin film transistor 120 is driven, and a source region and a drain region on both sides of the channel region. The source region refers to a portion of the active layer 121 connected to the source electrode 122, and the drain region refers to a portion of the active layer 121 connected to the drain electrode 123.

The gate insulating layer 112 may be disposed on the active layer 121 of the thin film transistor 120. The gate insulating layer 112 may be formed of a single layer of silicon nitride (SiNx) or silicon oxide (SiOx) or a multilayer thereof. The gate insulating layer 112 has a contact hole through which the source electrode 122 and the drain electrode 123 of the thin film transistor 120 are connected to the source region and the drain region of the active layer 121 of the thin film transistor 120, respectively.

The gate electrode 124 of the thin film transistor 120 may be disposed on the gate insulating layer 112. The gate electrode 124 may be formed of a single layer or a multilayer made of any one of molybdenum (Mo), copper (Cu), titanium (Ti), aluminum (Al), chromium (Cr), gold (Au), nickel (Ni), and neodymium (Nd), or alloys thereof. The gate electrode 124 may be formed on the gate insulating layer 112 to overlap with the channel region of the active layer 121 of the thin film transistor 120.

The first interlayer insulating layer 113 may be disposed on the gate insulating layer 112 and the gate electrode 124. The first interlayer insulating layer 113 may be formed of a single layer of silicon nitride (SiNx) or silicon oxide (SiOx) or a multilayer thereof. A contact hole for exposing the source region and the drain region of the active layer 121 of the thin film transistor 120 may be formed in the first interlayer insulating layer 113.

The conductive layer 160 may be disposed on the first interlayer insulating layer 113. The conductive layer 160 may be lines or electrodes disposed among the gate electrode 124, the source electrode 122 and the drain electrode 123.

The second interlayer insulating layer 114 may be disposed on the first interlayer insulating layer 113 and the conductive layer 160. The second interlayer insulating layer 114 may be formed of the same material as the first interlayer insulating layer 113. That is, the second interlayer insulating layer 114 may be formed of a single layer of silicon nitride (SiNx) or silicon oxide (SiOx) or a multilayer thereof. A contact hole for exposing the source region and the drain region of the active layer 121 of the thin film transistor 120 may be formed in the second interlayer insulating layer 114.

The source electrode 122 and the drain electrode 123 of the thin film transistor 120 may be disposed on the second interlayer insulating layer 114.

The source electrode 122 and the drain electrode 123 of the thin film transistor 120 may be connected to the active layer 121 of the thin film transistor 120 through contact holes formed in the gate insulating layer 112, the first interlayer insulating layer 113, and the second interlayer insulating layer 114. Accordingly, the source electrode 122 of the thin film transistor 120 may be connected to the source region of the active layer 121 through the contact holes formed in the gate insulating layer 112, the first interlayer insulating layer 113, and the second interlayer insulating layer 114. In addition, the drain electrode 123 of the thin film transistor 120 may be connected to the drain region of the active layer 121 through the contact holes formed in the gate insulating layer 112, the first interlayer insulating layer 113, and the second interlayer insulating layer 114.

The source electrode 122 and the drain electrode 123 of the thin film transistor 120 may be formed by the same process. In addition, the source electrode 122 and the drain electrode 123 of the thin film transistor 120 may be formed of the same material. The source electrode 122 and the drain electrode 123 of the thin film transistor 120 may be formed of a single layer or a multilayer made of any one of molybdenum (Mo), copper (Cu), titanium (Ti), aluminum (Al), chromium (Cr), gold (Au), nickel (Ni), and neodymium (Nd), or alloys thereof.

The first planarization layer 115 may be disposed on the source electrode 122, the drain electrode 123, and the second interlayer insulating layer 114. As illustrated in FIG. 3, a contact hole for exposing the drain electrode 123 may be formed in the first planarization layer 115. The first planarization layer 115 may be an organic material layer for planarizing an upper portion of the thin film transistor 120. For example, the first planarization layer 115 may be formed of an organic material, such as an acryl resin, an epoxy resin, a phenolic resin, a polyamide resin, a polyimide resin, etc. However, the present disclosure is not limited thereto, and the first planarization layer 115 may be an inorganic material layer for protecting the thin film transistor 120. For example, the first planarization layer 115 may be formed of an inorganic material such as silicon nitride (SiNx) or silicon oxide (SiOx). The first planarization layer 115 may be formed of a single layer of silicon nitride (SiNx) or silicon oxide (SiOx) or a multilayer thereof.

The connection electrode 190 may be disposed on the first planarization layer 115. In addition, the connection electrode 190 may be connected to the drain electrode 123 of the thin film transistor 120 through the contact hole of the first planarization layer 115. The connection electrode 190 may serve to electrically connect the thin film transistor 120 and the light emitting element 130. For example, the connection electrode 190 may serve to electrically connect the drain electrode 123 of the thin film transistor 120 and the first electrode 131 of the light emitting element 130. The connection electrode 190 may be formed in a single layer or a multilayer made of any one of molybdenum (Mo), copper (Cu), titanium (Ti), aluminum (Al), chromium (Cr), gold (Au), nickel (Ni), and neodymium (Nd), and or alloys thereof. The connection electrode 190 may be formed of the same material as the source electrode 122 and the drain electrode 123 of the thin film transistor 120.

The second planarization layer 116 may be disposed on the connection electrode 190 and the first planarization layer 115. In addition, as illustrated in FIG. 3, a contact hole for exposing the connection electrode 190 may be formed in the second planarization layer 116. The second planarization layer 116 may be an organic material layer for planarizing an upper portion of the thin film transistor 120. For example, the second planarization layer 116 may be formed of an organic material such as an acryl resin, an epoxy resin, a phenolic resin, a polyamide resin, a polyimide resin, etc.

The light emitting element 130 may be disposed on the second planarization layer 116. The light emitting element 130 may include a first electrode 131, a light emitting structure 132, and a second electrode 133. The first electrode 131 of the light emitting element 130 may be disposed on the second planarization layer 116. The first electrode 131 may be electrically connected with the connection electrode 190 through the contact hole formed in the second planarization layer 116. Accordingly, the first electrode 131 of the light emitting element 130 is connected with the connection electrode 190 through the contact hole formed in the second planarization layer 116 to be electrically connected with the thin film transistor 120.

The first electrode 131 may be formed of a multilayer structure including a transparent conductive film and an opaque conductive film with high reflection efficiency. The transparent conductive layer may be made of a material having a relatively large work function value, such as indium-tin-oxide (ITO) or indium-zinc-oxide (IZO). In addition, the opaque conductive film may be formed in a single layer or a multilayer structure including Al, Ag, Cu, Pb, Mo, Ti, or an alloy thereof. For example, the first electrode 131 may be formed in a structure in which a transparent conductive layer, an opaque conductive layer, and a transparent conductive layer are sequentially stacked. However, the present disclosure is not limited thereto, and the first electrode 131 may be formed even in a structure in which the transparent conductive layer and the opaque conductive layer are sequentially stacked.

Since the display device 100 according to the exemplary aspect of the present disclosure is a top emission display device, the first electrode 131 may be an anode electrode. When the display device 100 is a bottom emission display device, the first electrode 131 disposed on the second planarization layer 116 may be a cathode electrode.

The bank 117 may be disposed on the first electrode 131 and the second planarization layer 116. An opening for exposing the first electrode 131 may be formed in the bank 117. The bank 117 may define a light emitting region of the display device 100, which may also be referred to as a pixel defining layer.

The light emitting structure 132 including a light emitting layer may be disposed on the first electrode 131.

The light emitting structure 132 of the light emitting element 130 may be formed by stacking a hole layer, a light emitting layer, and an electron layer on the first electrode 131 in the order or in the reverse order. In addition, the light emitting structure 132 may also include first and second light emitting structures facing each other with a charge generation layer interposed therebetween. In this case, the light emitting layer of any one of the first and second light emitting structures generates blue light, and the light emitting layer of the other structure of the first and second light emitting structures generates yellow-green light, so that white light may be generated through the first and second light emitting structures. The white light generated by the light emitting structure 132 may be incident on a color filter located on the upper portion of the light emitting structure 132 to implement a color image. In addition, a color image may be implemented by generating color light corresponding to each subpixel in each light emitting structure 132 without a separate color filter. For example, the light emitting structure 132 of a red (R) subpixel may generate red light, the light emitting structure 132 of a green (G) subpixel may generate green light, and the light emitting structure 132 of a blue (B) subpixel may generate blue light.

The second electrode 133 may be further disposed on the light emitting structure 132. The second electrode 133 of the light emitting element 130 may be disposed on the light emitting structure 132 to face the first electrode 131 with the light emitting structure 132 interposed therebetween. In the display device 100 according to the exemplary aspect of the present disclosure, the second electrode 133 may be a cathode electrode. The encapsulation unit 140 for suppressing penetration of moisture may be further disposed on the second electrode 133.

The encapsulation unit 140 may include a first inorganic encapsulation layer 141, an organic encapsulation layer 142, and a second inorganic encapsulation layer 143. The first inorganic encapsulation layer 141 of the encapsulation unit 140 may be disposed on the second electrode 133. In addition, the organic encapsulation layer 142 may be disposed on the first inorganic encapsulation layer 141. In addition, the second inorganic encapsulation layer 143 may be disposed on the organic encapsulation layer 142. The first inorganic encapsulation layer 141 and the second inorganic encapsulation layer 143 of the encapsulation unit 140 may be formed of an inorganic material, such as silicon nitride (SiNx) or silicon oxide (SiOx). The organic encapsulation layer 142 of the encapsulation unit 140 may be formed of an organic material, such as an acryl resin, an epoxy resin, a phenolic resin, a polyamide resin, a polyimide resin, etc.

The second inorganic encapsulation layer 143 may cover an upper surface and a side surface of each of the first inorganic encapsulation layer 141 and the organic encapsulation layer 142, and the second inorganic encapsulation layer 143 minimizes or blocks external moisture or oxygen from penetrating into the first inorganic encapsulation layer 141 and the organic encapsulation layer 142. At this time, the first inorganic encapsulation layer 141 and the second inorganic encapsulation layer 143 serve to block the penetration of moisture or oxygen, and the organic encapsulation layer 142 serves to planarize the upper portion of the first inorganic encapsulation layer 141. Accordingly, the encapsulation unit 140 may cover the gate driving circuit GIP and the dam in the display area A/A and the non-display area N/A. However, the configuration of the encapsulation layer 140 is not limited thereto.

The touch sensing unit 150 may be disposed on the second inorganic encapsulation layer 143 of the encapsulation unit 140. The touch sensing unit 150 may include touch electrodes 151 and 152 and a connection electrode 153.

The connection electrode 153 of the touch sensing unit 150 may be disposed on the second inorganic encapsulation layer 143. The connection electrode 153 is disposed at a point where the touch electrodes 151 and 152 disposed in different directions intersect to be used to connect the touch electrodes 151 and 152 disposed in any one direction. The connection electrode 153 may be formed of a transparent conductive layer, for example, a transparent conductive oxide such as ITO or IZO.

A touch insulating layer 154 may be disposed on the encapsulation unit 140 and the connection electrode 153. The touch insulating layer 154 may insulate the connection electrode 153 and the touch electrodes 151 and 152 from each other. In addition, the touch insulating layer 154 may be formed of an inorganic material layer or an organic material layer. When the touch insulating layer 154 is an inorganic material layer, the touch insulating layer 154 may be formed of a single layer of silicon nitride (SiNx) or silicon oxide (SiOx) or a multilayer thereof. In addition, when the touch insulating layer 154 is an organic material layer, the touch insulating layer 154 may be formed of an organic material, such as an acryl resin, an epoxy resin, a phenolic resin, a polyamide resin, a polyimide resin, etc. A contact hole for exposing the connection electrode 153 may be formed in the touch insulating layer 154.

A plurality of first touch electrodes 151 and a plurality of second touch electrodes 152 of the touch sensing unit 150 may be disposed on the touch insulating layer 154. The plurality of second touch electrodes 152 may be connected to the connection electrode 153 through a contact hole of the touch insulating layer 154. The plurality of second touch electrodes 152 may be connected to each other by the connection electrode 153.

The first touch electrode 151 and the second touch electrode 152 of the touch sensing unit 150 may be formed of a transparent conductive film such as indium-tin-oxide (ITO) or indium-zinc-oxide (IZO). However, the present disclosure is not limited thereto, and the first touch electrode 151 and the second touch electrode 152 may also be formed of an opaque conductive layer having an opening. When the first touch electrode 151 and the second touch electrode 152 are formed of the opaque conductive layer having the opening, the first touch electrode 151 and the second touch electrode 152 may be formed of a single layer or a multilayer made of any one of molybdenum (Mo), copper (Cu), titanium (Ti), aluminum (Al), chromium (Cr), gold (Au), nickel (Ni), and neodymium (Nd), or alloys thereof.

Figure 4:
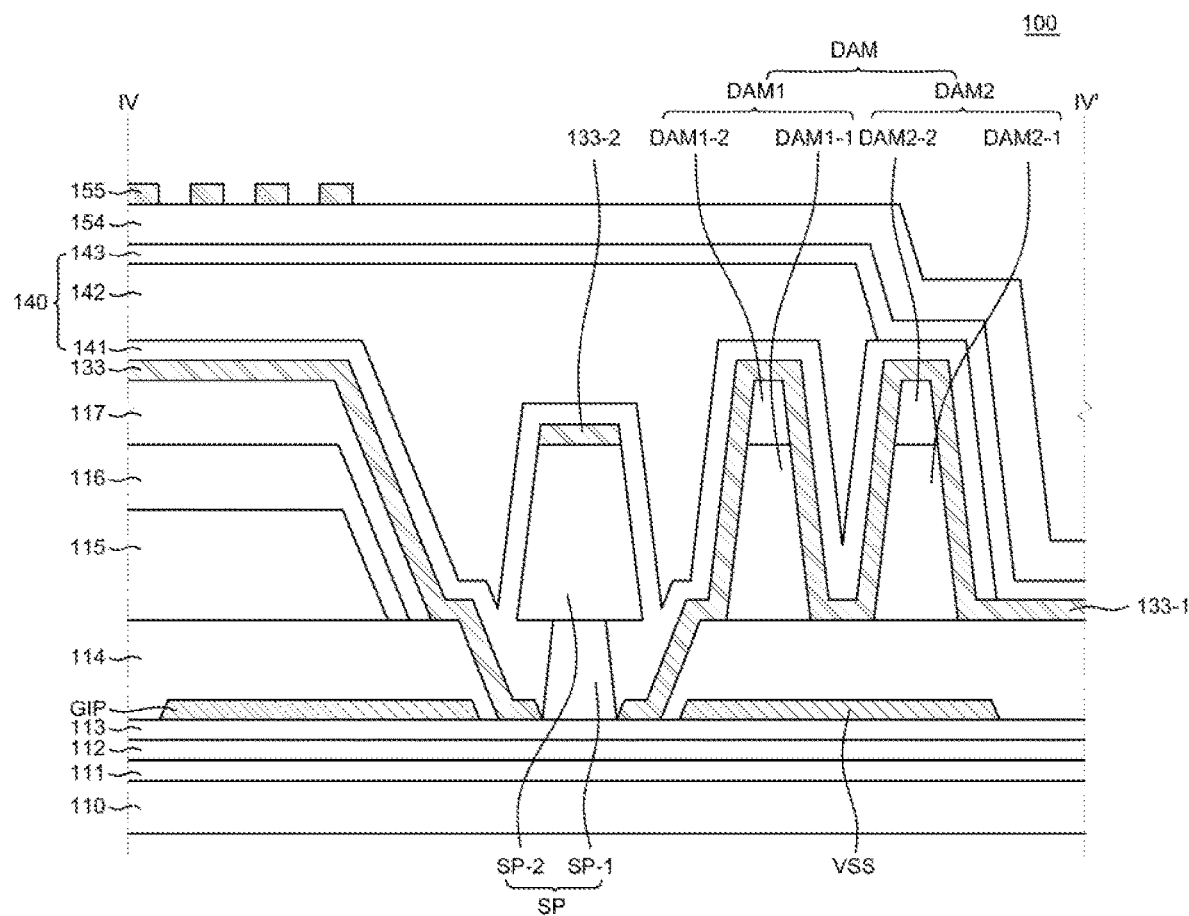
FIG. 4 is a cross-sectional view taken along line IV-IV' of FIG. 1.

FIG. 4 is a cross-sectional view taken along line IV-IV' of FIG. 1.

The gate driving circuit GIP, the low potential voltage line VSS, a dam DAM, the touch routing line 155, and a spacer SP may be disposed in the non-display area N/A of the display device 100.

The gate driving circuit GIP receives a gate control signal through gate control lines, generates gate signals according to the gate control signal, and sequentially outputs the signals to the gate lines of the display area A/A. The gate driving circuit GIP may be disposed in the non-display area N/A of the substrate 110 in a gate driver in panel (GIP) manner. The gate driving circuit GIP may be formed on the same layer as the conductive layer 160 of the display area A/A. That is, the gate driving circuit GIP may be disposed between the first interlayer insulating layer 113 and the second interlayer insulating layer 114. However, the present disclosure is not limited thereto.

The low potential voltage line VSS may supply a common voltage to the second electrode 133 of the light emitting element 130 formed in each pixel of the display area A/A. Accordingly, the low potential voltage line VSS may be disposed to surround the gate driving circuit GIP and the display area A/A. That is, the low potential voltage line VSS may be disposed in an outer region of the substrate 110 further than the gate driving circuit GIP. The low potential voltage line VSS may be formed on the same layer as the gate driving circuit GIP. That is, the low potential voltage line VSS may be formed on the same layer as the conductive layer 160 of the display area A/A, and may be disposed between the first interlayer insulating layer 113 and the second interlayer insulating layer 114. However, the present disclosure is not limited thereto.

The dam DAM may be disposed on the first interlayer insulating layer 114 in the non-display area N/A. The dam DAM is disposed to control the spread of the organic encapsulation layer forming the encapsulation unit disposed in the display area A/A and the non-display area N/A of the substrate 110. The dam DAM may include a first dam DAM1 and a second dam DAM2. The first dam DAM1 may surround the display area A/A adjacent to the display area A/A, and the second dam DAM2 may surround the outside of the first dam DAM1. In addition, as illustrated in FIG. 4, the first dam DAM1 and the second dam DAM2 may be disposed on the outside of the substrate 110 more than the gate driving circuit GIP, and may be disposed on the upper portion of the low potential voltage line VSS.

The first dam DAM1 and the second dam DAM2 may be formed in multiple layers. Specifically, the first dam DAM1 may include a first layer DAM1-1 of the first dam DAM1 and a second layer DAM1-2 of the first dam DAM1. In addition, the second dam DAM2 may include a first layer DAM2-1 of the second dam DAM2 and a second layer DAM2-2 of the second dam DAM2. The first layer DAM1-1 of the first dam DAM1 and the first layer DAM2-1 of the second dam DAM2 may be disposed on the second interlayer insulating layer 114. The first layer DAM1-1 of the first dam DAM1 and the first layer DAM2-1 of the second dam DAM2 may be formed on the same layer as the second planarization layer 116, and may be formed of the same material. However, the present disclosure is not limited thereto.

The second layer DAM1-2 of the first dam DAM1 may be disposed on the first layer DAM1-1 of the first dam DAM1. In addition, the second layer DAM2-2 of the second dam DAM2 may be disposed on the first layer DAM2-1 of the second dam DAM2. The second layer DAM1-2 of the first dam DAM1 and the second layer DAM2-2 of the second dam DAM2 may be formed on the same layer as the bank 117 and may be made of the same material.

However, in the exemplary aspect of the present disclosure, although the dam DAM is illustrated as having a double layer, the display device 100 is not limited thereto. For example, the dam DAM may be formed of three or more layers.

Next, the second electrode 133, that is, the cathode electrode may extend from the display area A/A to the non-display area N/A and may be disposed to overlap with the gate driving circuit GIP. The second electrode 133 may extend to a partial region of the non-display area N/A to be electrically connected to the low potential voltage line VSS disposed in the non-display area N/A. The second electrode 133 may extend along an upper surface of the bank 117, a side surface of the bank 117, and the second interlayer insulating layer 114 disposed in the non-display area N/A.

A capping layer may be further disposed on the second electrode 133 by protecting the light emitting element 130 to increase emission efficiency. Although not illustrated in the drawings, the capping layer may be disposed between the second electrode 133 and the first inorganic encapsulation layer 141 of the encapsulation unit 140. When the second electrode 133 is designed to extend from the display area A/A to the non-display area N/A over the first dam DAM1 and the second dam DAM2, the capping layer may be designed to extend together with the second electrode 133. However, the present disclosure is not limited thereto.

The encapsulation unit 140 for blocking penetration of moisture and oxygen into the light emitting element 130 may be disposed on the second electrode 133. In addition, the touch insulating layer 154 may be disposed on the encapsulation unit 140 in the non-display area N/A, and a plurality of touch routing lines 155 may be disposed on the touch insulating layer 154. The plurality of touch routing lines 155 may be disposed to overlap with the second electrode 133 as illustrated in FIG. 4. Each of the plurality of touch routing lines 155 electrically connects each of the plurality of touch electrodes 151 and 152 disposed in the display area AA to the plurality of pads PAD of the non-display area N/A. For example, a touch driving signal may be applied to the first touch electrode 151 through the touch routing line 155 connected to the first touch electrode 151, and a touch sensing signal may be transmitted to the second touch electrode 152 through the touch routing line 155 connected to the second touch electrode 152.

Next, the spacer SP may be disposed between the gate driving circuit GIP and the dam DAM on the substrate 110. That is, the spacer SP may be disposed between the gate driving circuit GIP and the low potential voltage line VSS. Since the gate driving circuit GIP is disposed on at least one side of a left side and a right side of the display area A/A, the spacer SP may also be disposed on at least one side of the left and right sides of the display area A/A.

The spacer SP may be formed of a multilayer. Specifically, the spacer SP may include a first spacer layer SP-1 and a second spacer layer SP-2. The first spacer layer SP-1 may be made of the same material as the first insulating layer disposed in the display area A/A and the non-display area N/A, and the second spacer layer SP-2 may be formed of the same material as the second insulating layer disposed in the display area A/A and the non-display area N/A. In this case, the first insulating layer disposed in the display area A/A and the non-display area N/A may be an inorganic insulating layer, and the second insulating layer may be an organic insulating layer. Specifically, the first insulating layer may be the second interlayer insulating layer 114 disposed in the display area A/A and the non-display area N/A, and the second insulating layer may be the second planarization layer 116 disposed in the display area A/A and the non-display area N/A. However, the present disclosure is not limited thereto.

The spacer SP may have an undercut structure. That is, the area of the upper surface of the first spacer layer SP-1 may be smaller than the area of the lower surface of the second spacer layer SP-2. As illustrated in FIG. 4, both the first spacer layer SP-1 and the second spacer layer SP-2 have tapered shapes, and an end of the upper surface of the first spacer layer SP-1 is disposed inside an end of the lower surface of the second spacer layer SP-2, so that an undercut structure may be formed in an inward direction. However, the present disclosure is not limited thereto, and as the thickness of the first spacer layer SP-1 is smaller than that of the second spacer layer SP-2, the first spacer layer SP-1 and the second spacer layer SP-2 may have various shapes, such as an inversed tapered shape.

As the spacer SP is formed in an undercut structure between the gate driving circuit GIP and the dam DAM, the second electrode 133 disposed to overlap with the gate driving circuit GIP may be disconnected by the spacer SP. That is, the cathode electrode may be disconnected by the spacer SP. When the second electrode 133 is disconnected by the spacer SP, the cathode electrode that is not connected to the light emitting element 130 of the display area A/A no longer functions as the cathode electrode, which may be referred to as a dummy conductive layer. Accordingly, a first dummy conductive layer 133-1 is disconnected from the second electrode 133 by the spacer SP and disposed on the dam DAM. In addition, a second dummy conductive layer 133-2 is disconnected from the second electrode 133 by the spacer SP and disposed on the spacer SP. The first dummy conductive layer 133-1 and the second dummy conductive layer 133-2 may be made of the same material as the second electrode 133 of the light emitting element 130, and may be formed by the same process. In addition, since the second electrode 133 is disconnected by the spacer SP, both side surfaces of the spacer SP may be covered by the encapsulation unit 140, and the side surface of the spacer SP may be in contact with the first inorganic encapsulation layer 141 of the encapsulation unit 140.

As described above, the spacer SP may be disposed between the gate driving circuit GIP and the low potential voltage line VSS. The low potential voltage line VSS is connected to the second electrode 133 of the light emitting element 130 to supply a low potential voltage to each pixel of the display area A/A. When the second electrode 133 is disconnected by the spacer SP, the low potential voltage line VSS may not be connected to the second electrode 133 of the light emitting element 130 in a region where the spacer SP is disposed. However, since the spacer SP may be disposed only on at least one side of the left and right sides of the display area A/A like the gate driving circuit GIP, the second electrode 133 and the low potential voltage line VSS may be electrically connected to each other on at least one side of an upper side and a lower side of the display area A/A. Alternatively, when the spacer SP is disposed on only one side of the left and right sides of the display area A/A, the second electrode 133 and the low potential voltage line VSS may also be electrically connected to each other on the other side thereof.

Accordingly, the display device 100 according to the exemplary aspect of the present disclosure may improve reliability by blocking the penetration of moisture and oxygen into the display device 100 while suppressing noise caused by the inflow of the driving signal.

When the driving signal that may be generated in the gate driving circuit and the like is introduced into the touch routing line, the driving signal acts as noise. That is, interference occurs between the driving signal and the touch sensing signal, which may occur in the gate driving circuit, etc., to cause interference in the touch routing line, which may lead to a touch noise problem in the touch sensing unit.

The driving signal that may be generated in the gate driving circuit and the like may be partially shielded by the second electrode disposed on the upper portion of the gate driving circuit. However, the second electrode, that is, the cathode electrode may extend only to a partial region of the non-display area and may be disconnected due to a design margin. In particular, since a deposition process of the second electrode uses a process method of depositing the entire surface using an open mask without performing a photo and etching process for forming a pattern, the end of the second electrode in the non-display area has a large process tolerance and may not cover a desired location. Therefore, in the related art, when the second electrode is not deposited enough to overlap up to the touch routing line disposed at the outermost side of the plurality of touch routing lines, since the second electrode does not play a shielding role between the touch routing line and the gate driving circuit, there is a problem in that the driving signal generated in the gate driving circuit reaches the touch routing line. That is, in the related art, due to the design margin of the second electrode, there was a problem in that the driving signal is introduced into the touch routing line and causes a touch noise defect.

Accordingly, in the display device 100 according to the exemplary aspect of the present disclosure, the second electrode 133 may be designed to be extended to shield the driving signal that may be generated in the gate driving circuit GIP and the like. That is, in the deposition process of the second electrode 133, the second electrode 133 may be formed using an open mask so as to cover the upper portion of the dam DAM in the non-display area N/A. Accordingly, the second electrode 133 may completely cover the gate driving circuit GIP. Accordingly, in the display device 100 according to the exemplary aspect of the present disclosure, the second electrode 133 completely covers the gate driving circuit GIP, thereby minimizing the interference between the driving signal of the gate driving circuit GIP and the touch signal from occurring.

However, when the second electrode 133 extends to cover the upper portion of the dam DAM of the non-display area N/A, the second electrode 133 may be exposed to the outside of the encapsulation unit 140. As such, when the second electrode 133 is exposed to the outside of the encapsulation unit 140, there is a risk of penetration of moisture and oxygen into the display device 100.

Accordingly, in the display device 100 according to the exemplary aspect of the present disclosure, the spacer SP is disposed between the gate driving circuit GIP and the dam DAM to disconnect the second electrode 133, thereby blocking the penetration of moisture and oxygen from the outside. The spacer SP may include a first spacer layer SP-1 and a second spacer layer SP-2, and the area of the upper surface of the first spacer layer SP-1 may be smaller than that of the lower surface of the second spacer layer SP-2. Accordingly, in the process of forming the second electrode 133, the second electrode 133 may be disconnected by the spacer SP. That is, as the end of the second spacer layer SP-2 is disposed to protrude from the end of the first spacer layer SP-1, the second electrode 133 may be disposed only inside the spacer SP to cover the gate driving circuit GIP, the first dummy conductive layer 133-1 may be disposed on the upper portion of the dam DAM, and the second dummy conductive layer 133-2 may be disposed on the upper portion of the spacer SP. Accordingly, in the display device 100 according to the exemplary aspect of the present disclosure, even if the moisture and oxygen are introduced along the first dummy conductive layer 133-1 or the second dummy conductive layer 133-2, the second electrode 133 is disconnected by the spacer SP, thereby blocking the penetration of moisture and oxygen into the light emitting element 130 of the display area A/A.

Figure 5:
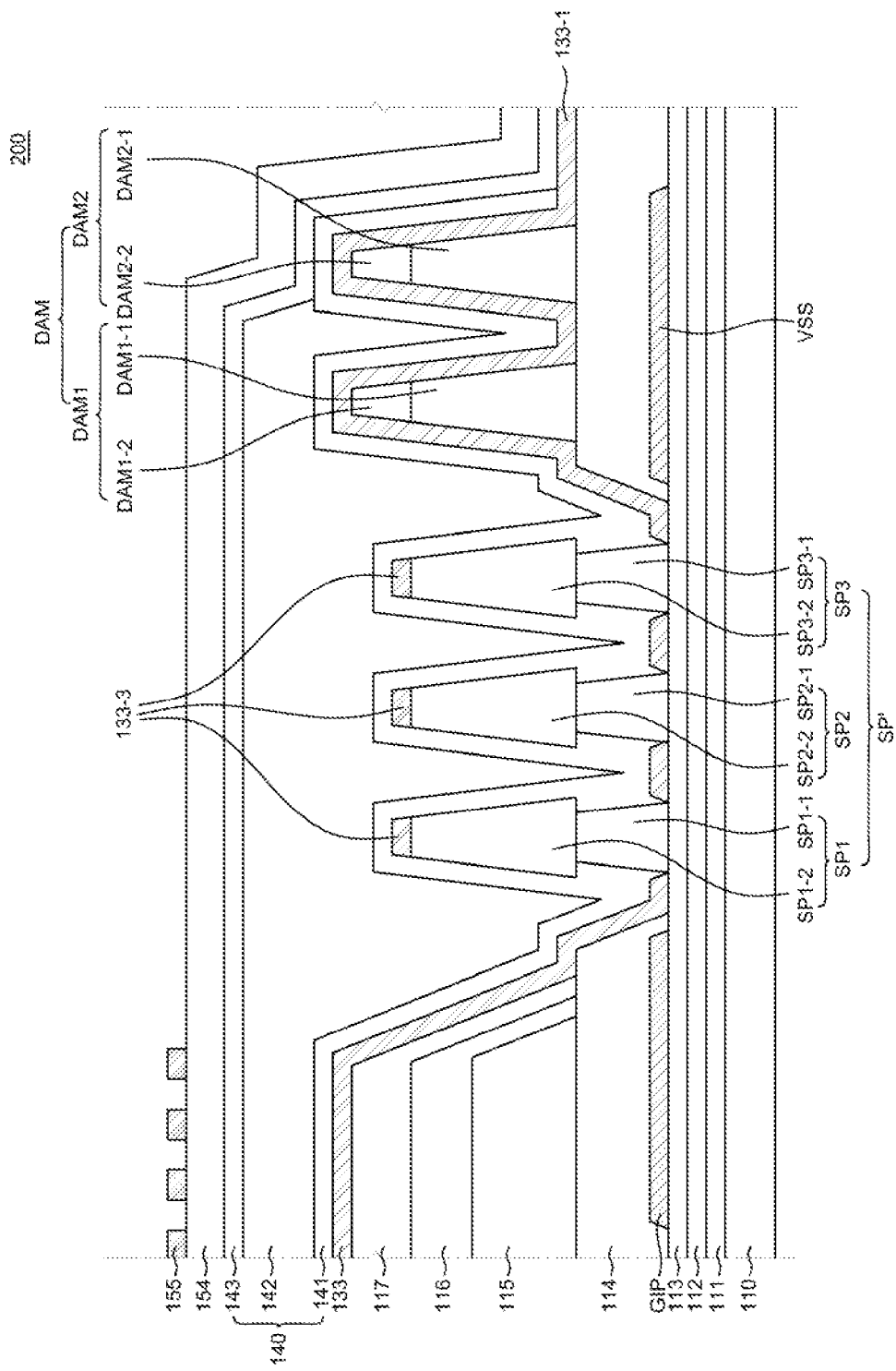
FIG. 5 is a cross-sectional view of a display device according to another exemplary aspect of the present disclosure.

FIG. 5 is a cross-sectional view of a display device according to another exemplary aspect of the present disclosure. As compared with the display device 100 of FIGS. 1 to 4, a display device 200 of FIG. 5 is substantially the same as the display device 100 except that a spacer SP' and a second dummy conductive layer S 133-3 are in plural, and thus, the duplicated description will be omitted.

Referring to FIG. 5, a plurality of spacers SP' may be disposed between the gate driving circuit GIP and the dam DAM on the substrate 110. That is, the plurality of spacers SP' may be disposed between the gate driving circuit GIP and the low potential voltage line VSS. Since the gate driving circuit GIP is disposed on at least one side of the left and right sides of the display area A/A, the plurality of spacers SP' may also be disposed on at least one side of the left and right sides of the display area A/A.

The plurality of spacers SP' includes a first spacer SP1, a second spacer SP2, and a third spacer SP3. The first spacer SP1 is a spacer closest to the gate driving circuit GIP among the plurality of spacers SP', the third spacer SP3 is a spacer closest to the low potential voltage line VSS among the plurality of spacers SP', and the second spacer SP2 is a spacer disposed between the first spacer SP1 and the third spacer SP3.

The plurality of spacers SP' may be formed of multiple layers, respectively. Specifically, the first spacer SP1 includes a first spacer layer SP1-1 and a second spacer layer SP1-2, the second spacer SP2 includes a first spacer layer SP2-1 and a second spacer layer SP2-2, and the third spacer SP3 includes a first spacer layer SP3-1 and a second spacer layer SP3-2. The first spacer layer SP1-1 of the first spacer SP1, the first spacer layer SP2-1 of the second spacer SP2, and the first spacer layer SP3-1 of the third spacer SP3 may be made of the same material as the first insulating layer disposed in the display area A/A and the non-display area N/A. The second spacer layer SP1-2 of the first spacer SP1, the second spacer layer SP2-2 of the second spacer SP2, and the second spacer layer SP3-2 of the third spacer SP3 may be made of the same material as the second insulating layer disposed in the display area A/A and the non-display area N/A. In this case, the first insulating layer disposed in the display area A/A and the non-display area N/A may be an inorganic insulating layer, and the second insulating layer may be an organic insulating layer. Specifically, the first insulating layer may be the second interlayer insulating layer 114 disposed in the display area A/A and the non-display area N/A, and the second insulating layer may be the second planarization layer 116 disposed in the display area A/A and the non-display area N/A. However, the present disclosure is not limited thereto.

The plurality of spacers SP' may have undercut structures. That is, the area of each of the upper surfaces of the first spacer layer SP1-1 of the first spacer SP1, the first spacer layer SP2-1 of the second spacer SP2, and the first spacer layer SP3-1 of the third spacer SP3 may be smaller than that of each of the lower surfaces of the second spacer layer SP1-2 of the first spacer SP1, the second spacer layer SP2-2 of the second spacer SP2, and the second spacer layer SP3-2 of the third spacer SP3. As illustrated in FIG. 5, the first spacer layer SP1-1 of the first spacer SP1, the first spacer layer SP2-1 of the second spacer SP2, and the first spacer layer SP3-1 of the third spacer SP3, and the second spacer layer SP1-2 of the first spacer SP1, the second spacer layer SP2-2 of the second spacer SP2, and the second spacer layer SP3-2 of the third spacer SP3 all have tapered shapes. In addition, the ends of the upper surfaces of the first spacer layer SP1-1 of the first spacer SP1, the first spacer layer SP2-1 of the second spacer SP2, and the first spacer layer SP3-1 of the third spacer SP3 are disposed inside the ends of the lower surfaces of the second spacer layer SP1-2 of the first spacer SP1, the second spacer layer SP2-2 of the second spacer SP2, and the second spacer layer SP3-2 of the third spacer SP3. Accordingly, the undercut structure may be formed in an inward direction, but the present disclosure is not limited thereto. The thicknesses of the first spacer layer SP1-1 of the first spacer SP1, the first spacer layer SP2-1 of the second spacer SP2, and the first spacer layer SP3-1 of the third spacer SP3 are smaller than those of the second spacer layer SP1-2 of the first spacer SP1, the second spacer layer SP2-2 of the second spacer SP2, and the second spacer layer SP3-2 of the third spacer SP3. In addition, the first spacer layer SP1-1 of the first spacer SP1, the first spacer layer SP2-1 of the second spacer SP2, and the first spacer layer SP3-1 of the third spacer SP3, and the second spacer layer SP1-2 of the first spacer SP1, the second spacer layer SP2-2 of the second spacer SP2, and the second spacer layer SP3-2 of the third spacer SP3 may have various shapes such as an inversed tapered shape.

As the plurality of spacers SP' is formed in undercut structures between the gate driving circuit GIP and the dam DAM, the second electrode 133 disposed to overlap with the gate driving circuit GIP may be easily disconnected by the plurality of spacers SP'. Accordingly, the first dummy conductive layer 133-1 is disconnected from the second electrode 133 by the spacer SP' and disposed on the dam DAM. In addition, a plurality of second dummy conductive layers 133-3 is disconnected from the second electrode 133 by the spacer SP' and disposed on the plurality of spacers SP'. The first dummy conductive layer 133-1 and the plurality of second dummy conductive layers 133-3 may be made of the same material as the second electrode 133 of the light emitting element 130, and may be formed by the same process.

In the display device 200 according to another exemplary aspect of the present disclosure, the second electrode 133 may be designed to be extended to shield the driving signal that may be generated in the gate driving circuit GIP. That is, in the deposition process of the second electrode 133, the second electrode 133 may be formed using an open mask so that the second electrode 133 may also cover the upper portion of the dam DAM in the non-display area N/A. Accordingly, the second electrode 133 may completely cover the gate driving circuit GIP. Accordingly, in the display device 200 according to another exemplary aspect of the present disclosure, the second electrode 133 completely covers the gate driving circuit GIP, thereby minimizing interference between the driving signal of the gate driving circuit GIP and the touch signal from occurring.

In addition, in the display device 200 according to another exemplary aspect of the present disclosure, the plurality of spacers SP' is disposed between the gate driving circuit GIP and the dam DAM to disconnect the second electrode 133, thereby blocking the penetration of moisture and oxygen from the outside. Since each of the plurality of spacers SP' has an inversed tapered shape, the second electrode 133 may be more reliably disconnected. Accordingly, in the display device 200 according to another exemplary aspect of the present disclosure, even if the moisture and the oxygen are introduced along the first dummy conductive layer 133-1 or the plurality of second dummy conductive layers 133-3, the second electrode 133 is disconnected by the plurality of spacers SP', thereby blocking the penetration of moisture and oxygen into the light emitting element 130 of the display area A/A.

The exemplary aspects of the present disclosure can also be described as follows:

According to an aspect of the present disclosure, there is provided a display device. The display device includes a substrate including a display area and a non-display area surrounding the display area. The display device further includes a gate driving circuit disposed on the substrate and in the non-display area. The display device further includes a light emitting element disposed in the display area and on the substrate and including a cathode electrode. The display device further includes a dam disposed on the substrate and in the non-display area, the dam further outside the substrate than the gate driving circuit on the substrate. The display device further includes a first dummy conductive layer disposed to cover the dam and made of the same material as the cathode electrode. The display device further includes a spacer disposed between the gate driving circuit and the dam on the substrate. The cathode electrode extends from the display area to the non-display area to overlap with the gate driving circuit.

The display device may further include an encapsulation unit covering the gate driving circuit, the dam and the light emitting element. The display device may further include a touch sensing unit disposed on the encapsulation unit. The touch sensing unit may include a touch electrode disposed in the display area and a touch routing line connected to the touch electrode and disposed in the non-display area. The touch routing line may overlap with the cathode electrode.

The cathode electrode and the first dummy conductive layer may be disconnected by the spacer.

The display device may further include a first insulating layer disposed in the display area and the non-display area on the substrate. The display device may further include a second insulating layer disposed on the first insulating layer. The spacer may include a first spacer layer made of the same material as the first insulating layer and a second spacer layer made of the same material as the second insulating layer. The spacer may have an undercut structure.

An area of an upper surface of the first spacer layer may be smaller than that of a lower surface of the second spacer layer.

The first insulating layer may be an inorganic insulating layer. The second insulating layer may be an organic insulating layer.

A side surface of the spacer may be in contact with an encapsulation unit.

The display device may further include a second dummy conductive layer disposed on the spacer and made of the same material as the cathode electrode.

The gate driving circuit may be disposed on at least one side of a left side and a right side of the display area.

The display device may further include a low potential voltage line electrically connected to the cathode electrode. The spacer may be disposed between the gate driving circuit and the low potential voltage line.

The cathode electrode and the low potential voltage line may be electrically connected to each other in at least one side of an upper side and a lower side of the display area.

The low potential voltage line may be formed on the same layer as the gate driving circuit.

The first spacer layer and the second spacer layer may have inversed tapered shapes.

The spacer may include one or more spacer.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device comprising:
   a substrate including a display area and a non-display area surrounding the display area;
   a gate driving circuit disposed on the substrate in the non-display area;
   a light emitting element disposed on the substrate in the display area and including a cathode electrode;
   a dam disposed on the substrate in the non-display area, the dam disposed further outside the substrate than the gate driving circuit;
   a first dummy conductive layer covering the dam in the non-display area and made of a same material as the cathode electrode; and
   a spacer disposed on the substrate between the gate driving circuit and the dam in the non-display area,
   wherein the cathode electrode extends from the display area to the non-display area and overlapping with the gate driving circuit.

2. The display device of claim 1, further comprising:
   an encapsulation unit covering the gate driving circuit, the dam and the light emitting element; and
   a touch sensing unit disposed on the encapsulation unit;
   wherein the touch sensing unit includes a touch electrode disposed in the display area and a touch routing line connected to the touch electrode and disposed in the non-display area, and
   wherein the touch routing line overlaps with the cathode electrode.

3. The display device of claim 1, wherein the cathode electrode and the first dummy conductive layer are disconnected by the spacer.

4. The display device of claim 1, further comprising:
   a first insulating layer disposed in the display area and the non-display area on the substrate; and
   a second insulating layer disposed on the first insulating layer,
   wherein the spacer includes a first spacer layer made of a same material as the first insulating layer and a second spacer layer made of a same material as the second insulating layer, and the spacer has an undercut structure.

5. The display device of claim 4, wherein an area of an upper surface of the first spacer layer is smaller than that of a lower surface of the second spacer layer.

6. The display device of claim 4, wherein the first insulating layer includes an inorganic insulating layer.

7. The display device of claim 4, wherein the second insulating layer includes an organic insulating layer.

8. The display device of claim 2, wherein a side surface of the spacer is in contact with the encapsulation unit.

9. The display device of claim 1, further comprising a second dummy conductive layer disposed on the spacer and made of a same material as the cathode electrode.

10. The display device of claim 1, wherein the gate driving circuit is disposed on at least one side of a left side and a right side of the display area.

11. The display device of claim 1, further comprising a low potential voltage line electrically connected to the cathode electrode,
   wherein the spacer is disposed between the gate driving circuit and the low potential voltage line.

12. The display device of claim 11, wherein the cathode electrode and the low potential voltage line are electrically connected to each other in at least one side of an upper side and a lower side of the display area.

13. The display device of claim 11, wherein the low potential voltage line is formed on the same layer as the gate driving circuit.

14. The display device of claim 4, wherein at least one of the first spacer layer and the second spacer layer have inversed tapered shape.

15. The display device of claim 1, wherein the spacer includes one or more spacer.

* * * * *